United States Patent
Markert et al.

(10) Patent No.: US 6,710,590 B1
(45) Date of Patent: Mar. 23, 2004

(54) TEST HEAD HIFIX FOR SEMICONDUCTOR DEVICE TESTING APPARATUS

(75) Inventors: Niels Markert, Santa Clara, CA (US);
Anthony Le, Santa Clara, CA (US);
Hiroki Yamoto, Santa Clara, CA (US);
Robert Sauer, Santa Clara, CA (US)

(73) Assignee: Advantest Corporation, Ora-gun (JP)

(*) Notice: Subject to any disclaimer, the term of this patent is extended or adjusted under 35 U.S.C. 154(b) by 0 days.

(21) Appl. No.: 10/319,110

(22) Filed: Dec. 12, 2002

(51) Int. Cl.⁷ .............................................. G01R 31/02
(52) U.S. Cl. ..................................... 324/158.1; 324/754
(58) Field of Search .............................. 324/158.1, 754, 324/755, 761, 765

(56) References Cited

U.S. PATENT DOCUMENTS

| | | | | |
|---|---|---|---|---|
| 4,160,207 A | * | 7/1979 | Haines | 324/754 |
| 4,667,155 A | * | 5/1987 | Coiner et al. | 324/754 |
| 4,862,075 A | * | 8/1989 | Choi et al. | 324/753 |
| 5,001,422 A | * | 3/1991 | Dahlberg et al. | 324/763 |

* cited by examiner

Primary Examiner—Ernest Karlsen
(74) Attorney, Agent, or Firm—Morrison & Foerster LLP

(57) ABSTRACT

The present invention is directed to a test head Hifix of a semiconductor device testing apparatus that does not require disassembly for maintenance or repair of the semiconductor device testing apparatus. In one embodiment, the test head Hifix of a semiconductor device testing apparatus includes a plate that resides as the top surface of a test head and on which the assembly, loadboard, socket and DUT are mounted. The plate is attached to the test head in an arrangement that allows the plate along with the assembly, loadboard, socket and DUT to be easily moved without completely disassembling the plate, assembly and loadboard from the test head. In one embodiment, the plate is attached or coupled to the test head by hinges.

16 Claims, 3 Drawing Sheets

TEST HEAD HIFIX FOR SEMICONDUCTOR DEVICE TESTING APPARATUS

BACKGROUND OF THE INVENTION

1. Field of the Invention

The present invention relates to a semiconductor device testing apparatus and, more particularly, to a test head Hifix of a semiconductor device testing apparatus that does not require disassembly for maintenance or repair of the semiconductor device testing apparatus.

2. Description of the Related Art

Semiconductor device testing apparatuses test various types of semiconductor devices including integrated circuits. Integrated circuits are tested to ensure that they will function properly in the consumer domain. Because integrated circuits must be individually tested, it is desirable that a semiconductor device testing apparatus accurately test integrated circuits at a low manufacturing test cost.

During the fabrication process, integrated circuits are tested in wafer form and in packaged form. In wafer form, a probe card is used to establish a temporary electrical contact between the integrated circuit to be tested (known as the device-under-test or DUT) and the semiconductor device testing apparatus (known as automatic test equipment or ATE). After completion of testing in wafer form, the integrated circuit is packaged and tested. Testing in packaged form includes a performance board or loadboard as the interface between the DUT and the ATE. The loadboard is a multi-layer printed circuit board that is mounted directly on the ATE. The DUT is inserted into a socket on the loadboard to establish electrical contact for testing.

FIG. 1 illustrates a conventional ATE system for testing an integrated circuit in packaged form. A tester 1 generates test signals which are transmitted to a test head 2 through cables 3. The test head 2, as shown by the cut-away view, houses a plurality of printed circuit boards or pin cards 4. The test signals are transmitted from the pin cards 4 to contact pins or pogo pins 5. The contact pins are represented schematically in FIG. 1 by arrows. It should be noted that the number of contact pins is much greater than what is illustrated in FIG. 1 and that the various elements of the ATE system in FIG. 1 are not drawn to scale.

The pogo pins 5 extend through the top surface 6 of the test head 2, known as the test head Hifix. The pogo pins 5 are spring-loaded and press against the loadboard 7 to establish electrical contact for testing. The loadboard 7 is positioned for such contact by an assembly or locking mechanism 10 that is directly placed on the test head Hifix 6 The loadboard 7 is in turn a mount for socket 8. The DUT 9 in packaged form is inserted into socket 8 to establish electrical contact for testing. Thus, the test signals are transmitted from the tester 1 to the DUT 9 through the pin cards 4, contact pins 5, loadboard 7 and socket 8. The resulting signals from the DUT 9 are received by the tester 1 for evaluation through the same elements.

As illustrated in FIG. 1, the assembly 10, the loadboard 7, the socket 8 and the DUT 9 rest on the test head Hifix 6. The test head chassis generally includes a square or rectangular plate as the test head Hifix for covering the pin cards and cables within the test head. It is secured to the test head by screws 11 along the border of the chassis (only two screws are shown in FIG. 1). If maintenance or repair is required within the test head, the test head chassis must be entirely disassembled in order to access the parts within the test head. Disassembly requires undoing all of the screws and removing the entire Hifix, assembly and loadboard from the test head. It also requires disconnecting the pogo pins attached to pin cards from the assembly. This entire procedure is time consuming and increases the time for maintenance or repair, thereby increasing manufacturing test cost.

Moreover, the test head chassis must be entirely disassembled regardless of the reasons for the maintenance or repair. Minor maintenance or repairs requires the same disassembly procedure as for a major maintenance or repair. As a result, even for minor maintenance and repairs, the test head becomes completely inoperable thereby stopping the testing of the DUT and increasing manufacturing test cost.

BRIEF SUMMARY OF THE INVENTION

It is an object of the present invention to provide a semiconductor device testing apparatus that overcomes the above limitations. The semiconductor device testing apparatus of the present invention includes a test head Hifix that does not require disassembly for maintenance or repair of the semiconductor testing apparatus. In one embodiment, the test head Hifix of a semiconductor device testing apparatus includes a plate that resides as the top surface of a test head and on which the assembly, loadboard, socket and DUT are mounted. The plate is attached to the test head in an arrangement that allows the plate along with the assembly, loadboard, socket and DUT to be easily moved to provide access to pogo pins and pin cards without disassembling the plate, assembly and loadboard from the test head. In one embodiment, the plate is attached or coupled to the test head by hinges.

The semiconductor device testing apparatus of the present invention allows various parts of the apparatus such as the pin cards and cables to be easily accessed for maintenance or repair. For example, electrical measurements can be made on pin cards to determine a malfunction without complete disassembly. By avoiding complete disassembly, the semiconductor device testing apparatus can also remain operational for testing of the DUT, thereby reducing manufacturing test cost. Indeed, the design and continued operability of the semiconductor device testing apparatus of the present invention allows for other measurement instruments to be easily connected for testing of the DUT.

These and other features and advantages of embodiments of the present invention will be apparent to those skilled in the art from the following detailed description of the embodiments of the invention, when read with the drawings and the appended claims.

DETAILED DESCRIPTION OF THE INVENTION

In the following description of preferred embodiments, reference is made to accompanying drawings which form a part hereof and in which is shown by way of illustration specific embodiments in which the invention may be practiced. It is to be understood that other embodiments may be utilized and structural changes may be made without departing from the scope of the preferred embodiments of the present invention.

Figure 2A:
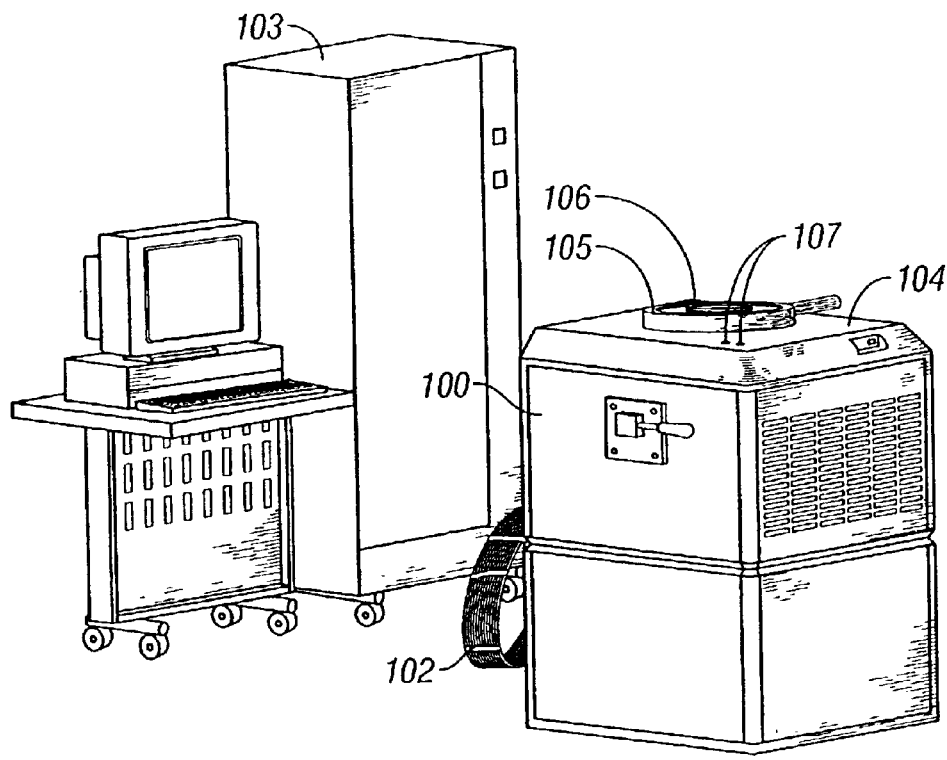
FIG. 2A is a perspective view of a test head of the present invention in the closed position.
Figure 2B:
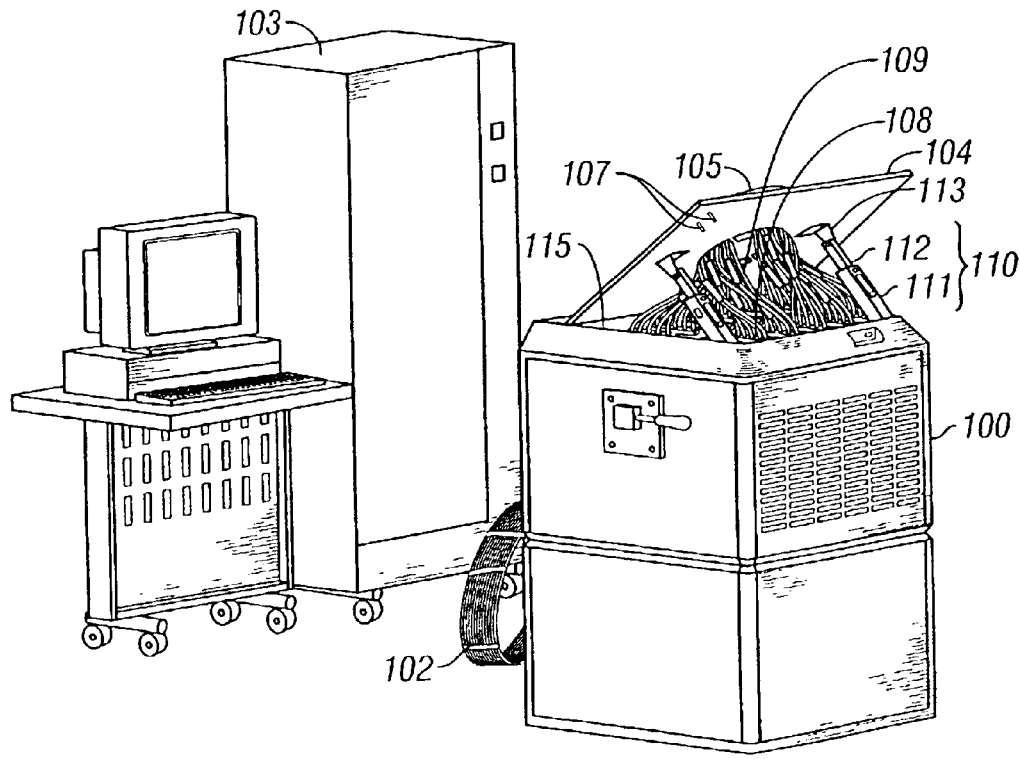
FIG. 2B is a perspective view of the test head in the open position.

FIGS. 2A and 2B illustrate an embodiment of the present invention in the closed and open positions, respectively. In FIG. 2A, test head 100 is connected by cables 102 to a tester 103. The cables 102 connect to pin cards (not illustrated) within the test head 100. A plate 104 is placed on the top of test head 100 as a base platform on which a locking mechanism or assembly 105 is mounted. The plate 104 covers the top surface of the tester 100 and thereby the internal parts of the tester 100, such as the pin cards. FIG. 2A illustrates the plate 104 as approximately equal in size to the top surface area of the tester 100. However, the plate 104 can be a different size, including smaller than the top surface area of the tester 100.

The loadboard, socket and DUT (which are not illustrated) are mounted onto the locking mechanism 105. In this manner, the plate 104 supports the locking mechanism 105, loadboard, socket and DUT. Upon mounting of the loadboard, socket and DUT on the locking mechanism 105, electrical connection is established between the loadboard and the pogo pins 106, which are fitted within the locking mechanism 105. Pogo pins 106 are connected to the pin cards in the test head 100 by wires (not illustrated) extending through the plate 104.

As FIG. 2B illustrates, one end of plate 104 is attached or coupled to the test head 100 by hinges (illustrated in FIGS. 3 and 4) such that the other end of plate 104 can be pivotally moved in relation to the test head 100. In this open position, the pogo pins (not illustrated), pin cards 108, wires 109 connecting the pin cards 108 to the pogo pins 106 and signal and power cables (not illustrated) are exposed for repair or maintenance without disassembling the plate 104 from the tester 100. If, for example, there is a malfunction, the substantially vertical position of the plate 104 in the open position allows for easy access for electrical measurements on the pin cards 108 or wires 109. In this manner, electrical measurements can easily be made on the pin cards 108 or wires 109 to determine the malfunction.

Moreover, as FIG. 2B illustrates, the test head can remain fully operational in the open position for testing of the DUT. The respective connections between the socket, DUT, loadboard, pogo pins 106 and the pin cards 108 are not disconnected in the open position. This allows the DUT to be tested in the open position, even during maintenance or repair.

The plate 104 can be maintained in this open position or any position between the open position and the closed position by a locking bar 110. FIG. 2B illustrates two locking bars 110 connected to the bottom surface of the plate 104 by brackets 113. Each locking bar 110 has a sliding member 112 within an encasing member 111. As the plate 104 is raised, the sliding member 112 slides out or extends from the encasing member 111. The sliding member 112 has notches at pre-determined lengths. When a notch is reached, the sliding member 112 is locked and holds the plate 104 at that position. In this manner, the plate 104 along with the locking mechanism 105, loadboard, socket and DUT can be held at different tilted positions which provides flexibility for maintenance or repair. It should be noted that the range of motion of the plate 104 is not limited to the range illustrated in FIG. 2B. For example, the plate 104 can be tilted to be substantially or completely vertical or even tilted more than 90 degrees with respect to the test head 100.

FIG. 2B illustrates the plate 104 being lifted through manual means. However, the plate 104 can be lifted and lowered by an automatic pneumatic motor or an electrical motor. When the plate 104 is lowered into the closed position, the plate 104 can either reside in a cavity 115 within the test head 100 as illustrated in FIG. 2B or on a support mechanism (not shown) of the test head 100. In this state, the plate 104 can be secured to the test head 100 with screws 107 (only two are illustrated) for testing, although such screws are not required.

It should be noted that testing of a DUT frequently requires the use of other instruments, such as electrical, thermal, mechanical and optical measurement instruments. To connect these instruments to the test head for testing, the entire test head must usually be tilted. This requires the use of expensive and space-consuming tilting devices. As FIG. 2B illustrates, the open position provides a convenient position to connect other instruments without the need for expensive and space-consuming tilting devices. In the open position illustrated in FIG. 2B, the plate 104 is in a substantially vertical position, thereby facilitating access and connection to another instrument. Because the test head can be fully operational in the open position, the DUT can be easily tested in the open position with the connected instruments.

Figure 1:
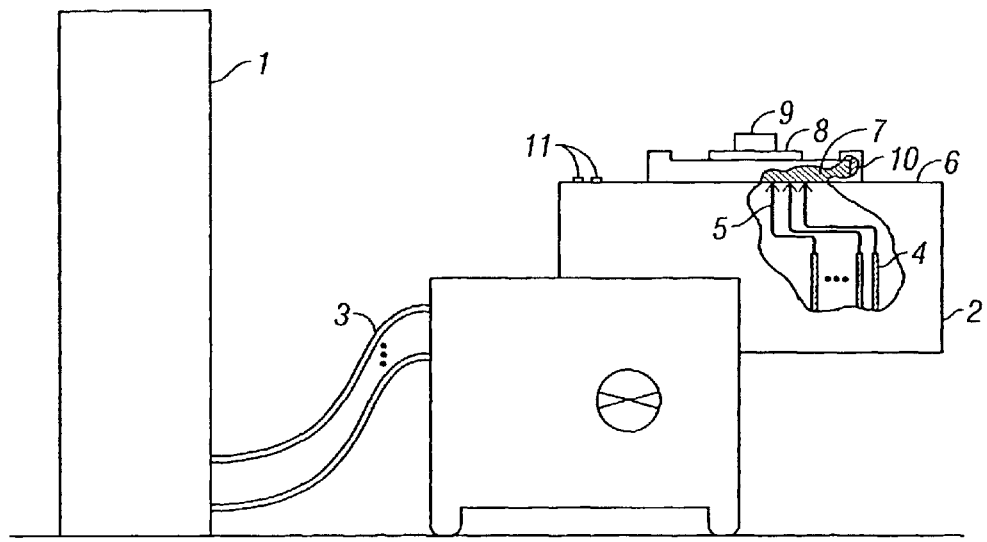
FIG. 1 is a side view of a conventional automatic test equipment system.
Figure 4A:
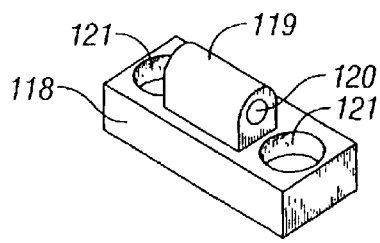
FIGS. 4A and 4B are perspective views of a hinge barrel and hinge body of the present invention, respectively.
Figure 4B:
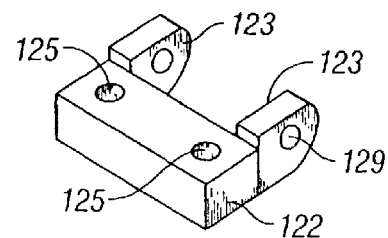
Figure 3A:
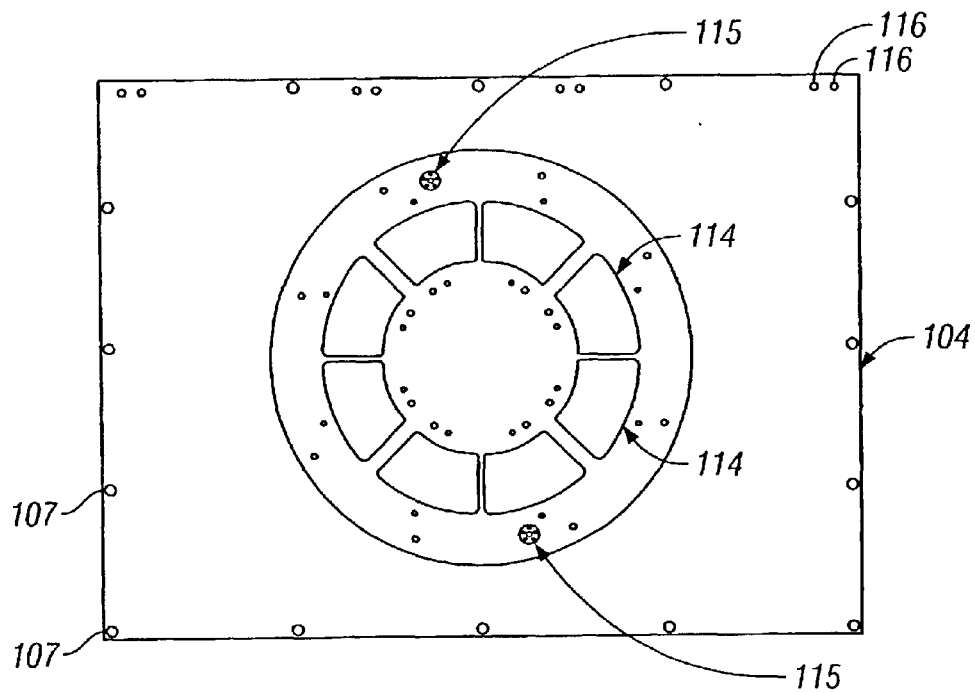
FIG. 3A is a top view of a plate of the present invention.
Figure 3B:
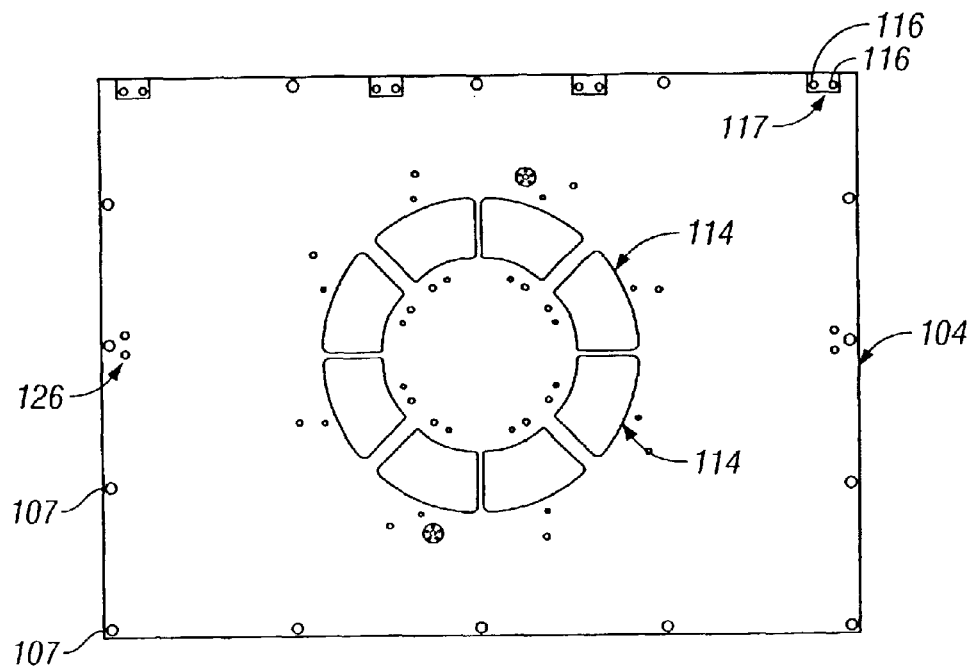
FIG. 3B is a bottom view of the plate.

FIGS. 3A and 3B illustrate a top view and a bottom view of plate 104, respectively, while FIGS. 4A and 4B illustrate the hinge barrel 118 and the hinge body 122. The following discussion references all four figures. The plate 104 is attached to the test head 100 though a number of hinges at one end of the plate. FIGS. 3A and 3B illustrate connections for four hinges, although any number of hinges may be used.

Plate 104 has four sets of holes 116 for connecting the hinge body 122 to the bottom of plate 104. Specifically, each hinge body 122 fits within a recess 117 in the bottom of plate 104. Each hinge body 122 is secured to the plate 104 by screws or bolts through holes 116 of the plate 104 and holes 125 of the hinge body 122.

Four corresponding hinge barrels 118 are secured to the test head 100 through holes 121 in a similar fashion. Each hinge barrel 118 includes a barrel 119 with a bore 120. The hinge barrel 118 is designed to fit within the arms 123 of the hinge body. Each arm 123 of a given hinge body 122 has a bore 129 corresponding in diameter to the bore 120 of the barrel 119. In this manner, a pin (not illustrated) can be inserted into the bores 119 and 120, thereby connecting the hinge barrel 118 to the hinge body 122 and coupling the plate 104 to the test head 100 for pivotal movement.

It should be noted that pogo pins 106 and their wires 109 are inserted in apertures 114 in FIGS. 3A and 3B and that the locking mechanism 105 is aligned with the test head Hifix through the alignment pins 115. FIG. 3B also illustrates the holes 126 for connecting the bracket 113 for the locking bar 110.

Although the present invention has been described with respect to testing integrated circuits in packaged form, the concept of the present invention is equally applicable to testing integrated circuits in wafer form. The concept of the present invention is also applicable to testing semiconductor devices other than integrated circuits.

Although the present invention has been fully described in connection with the preferred embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. An apparatus for testing a semiconductor device comprising:
   a tester for generating and receiving test signals;
   a plurality of cables connected to the tester for transmitting the test signals;
   a test head;
   a plurality of pin cards housed in the test head and connected to the plurality of cables;
   a plurality of contact pins connected to the plurality of pin cards;
   a plate comprising a plurality of apertures;
   means for coupling the plate to the test head to provide pivotal movement between an open position and a closed position wherein, in the closed position, the plate forms a closure with the test head;
   a circuit board for mounting said semiconductor device thereon; and
   an assembly secured to the plate and interconnected with the circuit board such that the plurality of contact pins extending through said plurality of apertures contact said circuit board to establish electrical contact between the tester and the semiconductor device.

2. The apparatus of claim 1 wherein the coupling means comprises a hinge having a first hinge unit secured to the plate, a second hinge unit secured to the test head and a pin pivotally connecting the first and second hinge units.

3. The apparatus of claim 2 wherein the first hinge unit has a pair of arms, each pair of arms having a first bore, wherein the second hinge unit has a shoulder sized and configured to fit between the pair of arms, said shoulder having a second bore and wherein the pin is received within the first and second bores.

4. The apparatus of claim 3 further comprising means for securing the first hinge unit to a recess of the plate.

5. The apparatus of claim 3 further comprising means for securing the second hinge unit to the test head.

6. The apparatus of claim 2 wherein the coupling means comprises a plurality of hinges.

7. The apparatus of claim 1 further comprising a means for locking the plate at the open position.

8. The apparatus of claim 7 wherein the locking means comprises an encasing member connected to the test head and a sliding member encased in the encasing member and connected to the plate.

9. The apparatus of claim 7 wherein the locking means locks the plate at a position between the open position and the closed position.

10. The apparatus of claim 1 wherein the plate at the closed position covers the top surface of the test head.

11. The apparatus of claim 1 wherein the test head comprises a cavity, said plate resting within said cavity at the closed position.

12. The apparatus of claim 1 further comprising means for pivotally moving the plate.

13. The apparatus of claim 12 wherein said moving means comprises an electrical motor.

14. The apparatus of claim 12 wherein said moving means comprises a pneumatic motor.

15. The apparatus of claim 1 wherein the plate in the open position is substantially vertical thereby facilitating connection with an instrument.

16. The apparatus of claim 1 wherein the plate in the open position is substantially vertical thereby facilitating measurement of the plurality of pin cards.

* * * * *